(12) United States Patent
Cochet et al.

(10) Patent No.: US 12,368,449 B2
(45) Date of Patent: Jul. 22, 2025

(54) DAC INL COMPENSATION THROUGH THERMOMETER SEGMENT TUNING

(71) Applicant: International Business Machines Corporation, Armonk, NY (US)

(72) Inventors: Martin Cochet, South Salem, NY (US); John Francis Bulzacchelli, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 203 days.

(21) Appl. No.: 18/091,484

(22) Filed: Dec. 30, 2022

(65) Prior Publication Data
US 2024/0223199 A1 Jul. 4, 2024

(51) Int. Cl.
*H03M 1/10* (2006.01)
(52) U.S. Cl.
CPC .................. *H03M 1/1014* (2013.01)
(58) Field of Classification Search
CPC ...... H03M 1/12; H03M 1/1047; H03M 1/123; H03M 1/10; H03M 1/009
USPC .................. 341/122, 144, 155, 118, 120
See application file for complete search history.

(56) References Cited

U.S. PATENT DOCUMENTS

| | | | | |
|---|---|---|---|---|
| 6,897,794 | B2 * | 5/2005 | Kuyel | H03M 1/1038 341/120 |
| 7,719,452 | B2 | 5/2010 | Bardsley | |
| 8,031,098 | B1 * | 10/2011 | Ebner | H03M 1/1061 341/146 |
| 8,564,463 | B2 | 10/2013 | Agi | |
| 9,379,728 | B1 | 6/2016 | Singh | |
| 9,484,947 | B1 | 11/2016 | Nguyen | |
| 10,581,442 | B2 | 3/2020 | Kauffman | |
| 10,855,300 | B2 | 12/2020 | Gruber | |
| 2008/0159374 | A1 | 7/2008 | Lin | |

(Continued)

FOREIGN PATENT DOCUMENTS

EP 2579463 B1 3/2014

OTHER PUBLICATIONS

Mukhopadhyay, I., et al., "Dual-Calibration Technique for Improving Static Linearity of Thermometer DACs for I/O", IEEE Transactions on Very Large Scale Integration (VLSI) Systems, Mar. 2016, pp. 1050-1058, vol. 24, No. 3.

(Continued)

*Primary Examiner* — Peguy Jean Pierre
(74) *Attorney, Agent, or Firm* — Scully, Scott, Murphy & Presser, P.C.; Kimberly S. Zillig

(57) ABSTRACT

A system and method for compensating segmented DAC intrinsic INL by adjusting the relative strength of DAC thermometer segments. In the method, the strength of each thermometer segment is adjusted sequentially to reduce INL to 0 at one point on each thermometer code range. The strength of the binary section is also adjusted to further reduce INL while conserving output amplitude. The system includes a calibration circuit that senses the DAC differential output and compares it to an ideal output generated from the same DAC via dithering between 0 and a maximum code. The compensation scheme only performs a specific type of DAC compensation, specifically compensating for systematic non-linearity rather than for mismatch-induced non-linearity. The method can also be applied to calibrate a full thermometer DAC.

20 Claims, 12 Drawing Sheets

(56) References Cited

U.S. PATENT DOCUMENTS

2014/0240152 A1* 8/2014 Song .................. H03M 1/1061
 341/120
2022/0006465 A1 1/2022 Yu
2024/0063809 A1* 2/2024 Mulder ............... H03M 1/1042

OTHER PUBLICATIONS

Toprack-Deniz, Z., et al., "A 128-GB/s 1.3-pJ/b PAM-4 Transmitter With Reconfigurable 3-Tap FFE in 14-nm CMOS", IEEE Journal of Solid-State Circuits, Jan. 2020, pp. 19-26, vol. 55, No. 1.

* cited by examiner

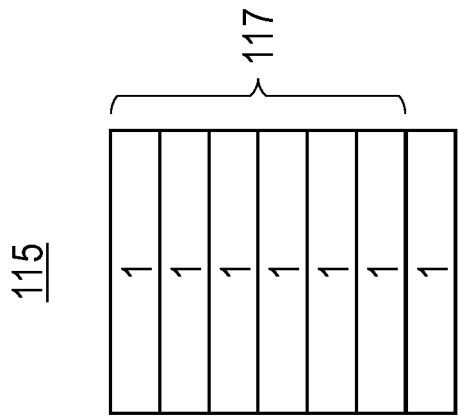
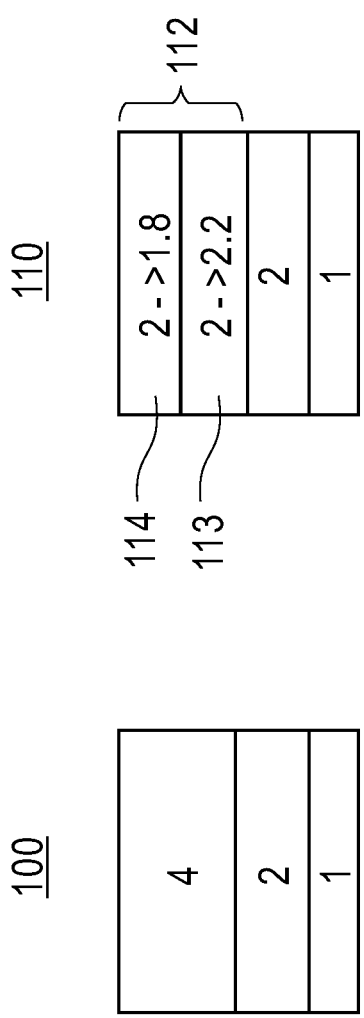
FIG. 1A
Codes
000->0
001->1
010->2
011->1+2=3
100->4
101->4+1=5
110->4+2=6
111->4+2+1=7
FIG. 1B
Codes
0000->0
0001->1
0010->2
0011->1+2=3
0110->2+2=4
0111->2+2+1=5
1110->2+2+2=6
1111->2+2+2+1=7
FIG. 1C
Codes
0000000->0
0000001->1
0000011->2
0000111->3
0001111->4
0011111->5
0111111->6
1111111->7

250

| Segment | Before | After |
|---|---|---|
| #1 | 1 | 1.026 |
| #2 | 1 | 1.085 |
| #3 | 1 | 1.156 |
| #4 | 1 | 1.241 |
| #5 | 1 | 1.350 |
| #6 | 1 | 1.493 |
| #7 | 1 | 1.695 |

260 { ... 262 ... 265

DAC INL COMPENSATION THROUGH THERMOMETER SEGMENT TUNING

BACKGROUND

The present disclosure is related to digital-to-analog converter (DAC) devices and particularly, a circuit and method for calibrating a DAC device.

There has been a dramatic rise of data transport, e.g., over the Internet, and wireline systems carrying such data are pressed for increasingly higher speeds. Integral nonlinearity (INL) reduction is important to improve high-speed wireline performance. Integral nonlinearity (INL) is a measure of performance in digital-to-analog converter (DAC) devices. In DACs, INL is a measure of the deviation between the ideal output value and the actual measured output value for a certain input code.

While DAC-based transmitters (TXs) operating at hundreds of gigabits per second are becoming the norm for high-speed wireline links, it is the case that differential drivers naturally introduce $3^{rd}$ order non-linearity. This DAC non-linearity, especially INL, can impact performance of wireline transmission.

One solution is for the DAC-based transmitter to include some partial thermometer encoding in the DAC to reduce the impacts of mismatch. In the literature, a DAC architecture in which some of the bits (typically the more significant bits) are encoded as thermometer bits, and the rest of the bits (typically the less significant bits) are encoded as binary bits, is commonly referred to as a "segmented" DAC architecture. Many of the current solutions target the calibration of random mismatches but do not address systematic INL.

SUMMARY

There is provided a system and method that leverages thermometer encoding of DAC-based transmitters (TX) to not only reduce the impacts of mismatch on DAC performance but also reduce integral non-linearity (INL).

In one aspect, there is provided a system for calibrating a digital-to-analog converter (DAC) device having thermometer encoded segments. The system for calibrating comprises: a comparison circuit having a first input for receiving a first output voltage of the DAC device responsive to an input digital code word; a reference digital-to-analog converter circuit (DAC) receiving the same input digital code word and outputting a second output voltage representing an ideal linear output of the DAC under calibration, a second input of the comparison circuit receiving the second output voltage, the comparison circuit comparing the first output voltage of the DAC under calibration and the second output voltage representing the ideal linear output to generate an output signal; and a processor device connected to an output of the comparison circuit for detecting the output signal, the processor device generating one or more calibration signals for input to the DAC for adjusting a signal strength of different thermometer encoded segments of the DAC under calibration to minimize the difference between the first output voltage of the DAC under calibration and the second output voltage representing the ideal linear output thereby reducing a DAC integral non linearity (INL).

In a further aspect, there is provided a system for calibrating a digital-to-analog converter (DAC) device having thermometer encoded segments. The system comprises: a code dithering circuit applying minimum and maximum input code words to the DAC under calibration at a determined duty-cycle to obtain a first output voltage comprising a time-averaged value proportional to a corresponding input digital code word with a high degree of linearity; a low-pass filter configured to remove high frequency components of the first output voltage comprising the time-averaged value from the DAC under calibration to generate a direct current (DC) signal that is equal to the time averaged value of the first output voltage; a logic circuit applying secondly a fixed input digital code word to the DAC under calibration, and the DAC under calibration generating subsequently a second output voltage; a comparison circuit receiving in a sequence, firstly the output DC signal of the low-pass filter circuit, and secondly the second output voltage for use in a comparison operation, the comparison circuit generating a representation of the DC signal for local storage in a memory before the comparison with the second output voltage to responsively generate an output signal; and a processor device connected to the output of the comparison circuit for detecting the output signal, the processor device generating one or more calibration signals for input to the DAC under calibration for adjusting a signal strength of different thermometer encoded segments of the DAC under calibration to minimize the difference between the DC signal representation and the subsequently received second output voltage to thereby reduce an integral non linearity (INL) of the DAC under calibration.

In a further aspect, there is provided a system for calibrating a digital-to-analog converter (DAC) device having thermometer encoded segments. The system comprises: a reference digital-to-analog converter circuit receiving an input digital code word and outputting a first output voltage representing an ideal linear output of the DAC under calibration; a logic circuit applying secondly the input digital code word to the DAC under calibration, and the DAC under calibration generating subsequently a second output voltage; a comparison circuit receiving in a sequence, initially the first output voltage from the reference digital-to-analog converter circuit, and subsequently the second output voltage for a comparison operation, the comparison circuit generating a representation of the first output voltage for local storage in a memory before the comparison with the second output voltage to responsively generate an output signal; and a processor device connected to the output of the comparison circuit for detecting the output signal, the processor device generating one or more calibration signals for input to the DAC under calibration for adjusting a signal strength of different thermometer encoded segments of the DAC under calibration to minimize the difference between the representation of the received first output voltage of the reference digital-to-analog converter circuit and the subsequently received second output voltage to thereby reduce an integral non linearity (INL) of the DAC under calibration.

Embodiments of the invention will be described in more detail below, by way of illustrative and non-limiting examples, with reference to the accompanying drawings.

BRIEF DESCRIPTION OF THE DRAWINGS

FIGS. 1A-1C depict conventional 3-bit DAC encoding schemes including a full binary encoding (in FIG. 1A), a partial thermometer encoding (FIG. 1B) and a full thermometer 3-bit DAC encoding (FIG. 1C);

DETAILED DESCRIPTION

Figure 2:
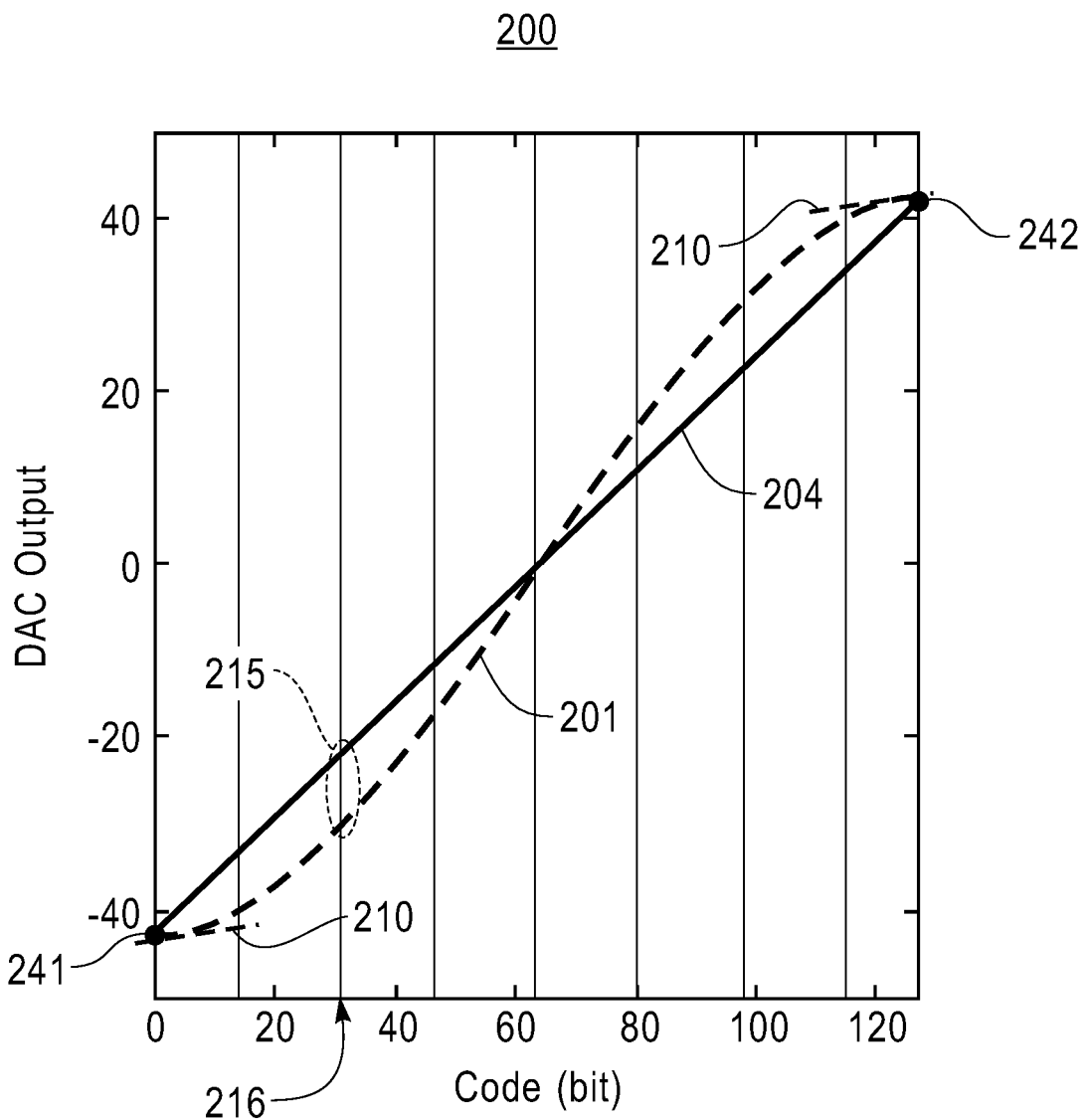
FIG. 2 illustrates a plot of output DAC voltage (Y-axis) as a function of input DAC input code (X-axis) with curves depicting the INL phenomena where there is a non-linear relation between single or differential DAC output voltage and the DAC digital input code.

In reference to FIGS. 1-10B, some general aspects and terms of embodiments of the invention are described.

By way of background, FIG. 1A shows an exemplary 3-bit DAC encoding 100 which is a full binary encoding, i.e., the 3-bit binary codes 000, 001, . . . , 111 enables analog outputs ranging from 0, 1, . . . , 7. Such a 3-bit DAC full binary encoding scheme is shown employing a most significant bit (MSB) weight value "4" as a 3-bit encoding "100" corresponding to 4 shown in FIG. 1A. In partial thermometer encoding, also called segmented DAC encoding, one or more bits, e.g., the most significant bit (MSB), is broken up into smaller weight chunks. For example, FIG. 1B shows a 3-bit DAC encoding 110 with 2 thermometer bits 113, 114 used to encode the MSB. For example, the code corresponding to MSB value of binary weight 4 in DAC 110 is 2 thermometer bits 112. i.e., two equally weighted bit segments 113, 114, that together encode a weight of value 4. For example, achieving an output value of 5 with the thermometer DAC 110 requires a codeword input of 0111, while achieving an output value of 7 requires four input bits (segments) encoded as 1111. FIG. 1C shows a full thermometer 3-bit DAC encoding 115 including an encoding that uses eight (8) 1-weighted equal (LSB) segments 117 and uses 7 thermometer input bits to encode any outputs of values 0, 1, . . . , 7. For example, to encode a weight of three (3), the corresponding encoding DAC 115 input is 0000111 (0+1+1+1), and encoding a weight of 7 corresponds to an encoding DAC 115 input of codeword 1111111.

To illustrate the DAC integral non-linearity (INL) phenomena, for the example case of 3-bit differential DAC with 2-bit thermometer encoding illustrated in FIG. 1B, the actual corresponding output voltage strength of each DAC segment corresponding to a thermometer bit may not be equally weighted. That is, corresponding to the MSB binary value of "4", a first thermometer bit segment 113 can produce a corresponding output signal strength (e.g., current or voltage) value of strength 2.2 and the second thermometer bit segment 114 can produce a corresponding output signal value of strength 1.8 as shown in FIG. 1B. Thus, while a pure thermometer encoded DAC should ideally have no error, i.e., every segment is nominally of equal strength with no mismatch error, this is often not the case because the DAC is not perfectly linear; the non-linearity is due to differences in output impedances of each segment which can be non-linear, i.e., as more voltage is being driven by a segment, the output current deviates from an expected value in a way that is a non-linear function of the output amplitude due to an output impedance mismatch of the current source device in each segment, thereby contributing to the INL error of the DAC device. Unlike DAC segment mismatch which induces DNL, the INL results from the overall DAC signal-dependent non-linearity and is present even with perfectly matched DAC segments. For purposes of discussion, it is assumed that the DAC output signal strength is a measured voltage.

FIG. 2 illustrates the compensating of the DAC integral non-linearity (INL) phenomena and the attendant benefits of thermometer bit DAC encoding that include less significant glitch potential and lower impact of mismatch.

FIG. 2 particularly illustrates a plot 200 of output DAC voltage (Y-axis) as a function of a 7-bit input DAC digital code (X-axis). In the plot of FIG. 2, the curve 201 depicts the INL phenomena where there is a non-linear relation between single or differential DAC output voltage and the DAC digital input code. Towards the middle of the curve 201, the slope is linear, however, it tends to flatten 210 at the input code extremes due to a compression, e.g., due to the change in output impedance of the DAC with the output voltage. Further shown in FIG. 2, there is depicted an ideal linear curve 204, i.e., a straight line that represents an ideal linear relationship between the DAC output voltage and the input digital DAC code. The INL for a given DAC input bit code is the difference between the curve 201 and curve 204 based on that given code, normalized to a least significant bit (LSB). For example, for a given DAC input bit code 216 corresponding to a value of 30, the INL is quantified as the difference 215 between the curve 201 and curve 204.

Generally, given a segmented DAC with N bits N=Nb+Nth where Nb is binary bits and Nth are thermometer bits, there can be a total of $Nb+2^{Nth}-1$ segments. Thus, for an example N-bit DAC, given N=7 bits and Nth=3, Nb=4, there would be a total of 11 $(4+2^3-1)$ segments. For an example where N=7 and Nth=5, then Nb is equal to 2, and the number of segments increases to $2+2^5-1=33$ segments. In an extreme case where N=Nth (all thermometer bits), then all segments can be individually tuned to provide an ideal 0 INL.

In embodiments herein for eliminating INL error, only the thermometer encoded bits (segments) are to be tuned. The calibration or tuning of thermometer bits includes measuring an average INL on each of the $2^{Nth}-1$ segments and adjusting each of the thermometer bit segments based on an average INL and/or on the INL at the center of each of the thermometer segments.

Figures 3A, 3B:
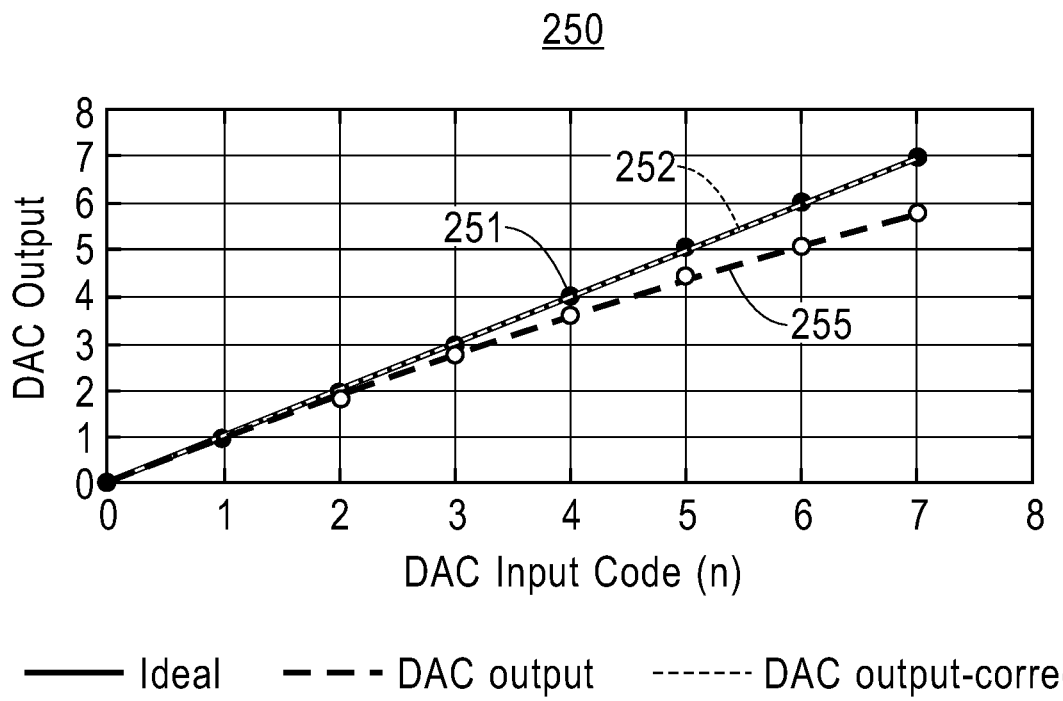
FIGS. 3A and 3B depict a result of a non-limiting example of an INL compensation scheme for an exemplary fully thermometer 3-bit DAC according to the embodiments of the present disclosure.

FIGS. 3A and 3B depict a result of a non-limiting example of INL compensation scheme for an exemplary fully thermometer 3-bit DAC according to the embodiments of the present disclosure. FIG. 3A depicts a plot 250 of DAC output (Y-axis) versus DAC input code [n] (X-axis) with a first curve 251 showing an ideal linear relationship between DAC input code [n] and DAC output signal strength with thermometer bit compensation as depicted as curve 252. The non-compensated curve 255 ("VOUTDAC") is shown without thermometer segment tuning. In the DAC INL example of FIG. 3A, a non-linearity is assumed according to the following function:

$$VOUTDAC = Videal - \frac{Videal^2}{40}.$$

As shown in the chart of FIG. 3B, by changing the strength of each of the seven (7) DAC segments 260 from a segment strength value '1' each at column 262 to the adjusted strength output values 265 on the right column, the DAC linearity can be restored, i.e., the non-compensated curve 255 approaches the linearity of the DAC output signal strength with thermometer bit compensation as depicted as curve 252.

For example, for an input code [n]=3, the original DAC output is $(1+1+1)-(1+1+1)^2/40=2.775$, and the DAC output after thermometer segment adjustment is: $(1.026+1.085+1.156)-(1.026+1.085+1.156)^2/40=3.000$. In this case where the DAC is fully thermometer encoded, the DAC intrinsic non-linearity can be fully compensated, resulting in an ideal INL=0 post calibration, i.e., DAC output 252 matches perfectly the ideal DAC output 251.

Figure 4A:
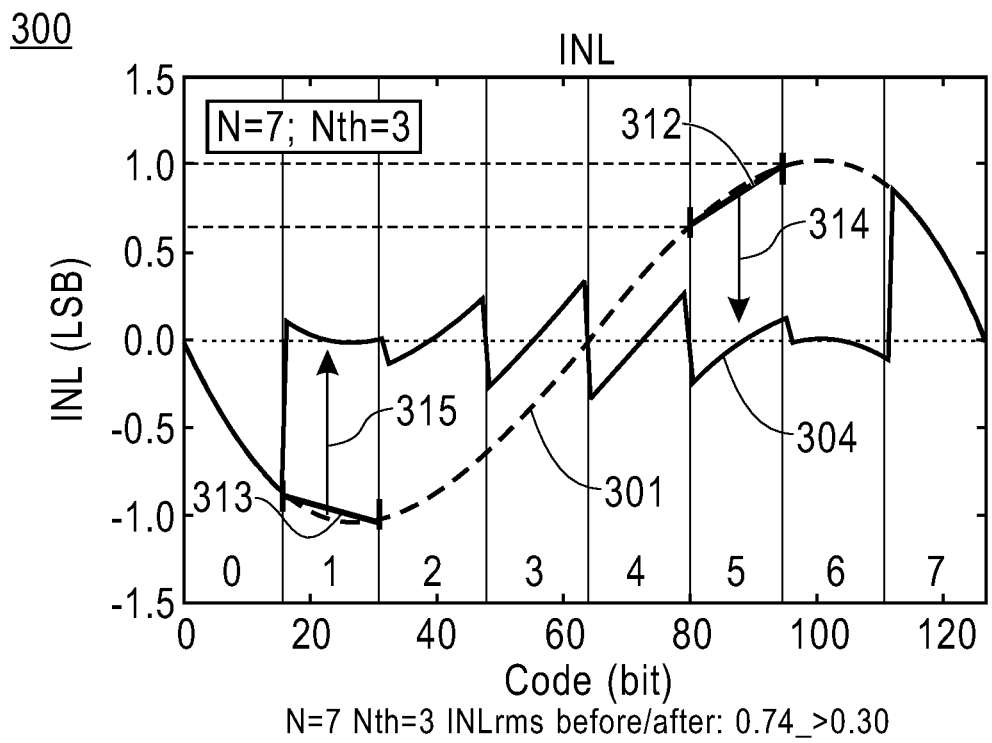
FIG. 4A depicts a plot of the INL (Y-axis) versus the DAC input code (X-axis) for the case of a 7-bit DAC (N=7) with INL curves depicted without applying compensation and with applying compensation, e.g., using three thermometer bits in an example embodiment.

FIG. 4A depicts a plot 300 of the INL (Y-axis) versus the DAC input code (X-axis) for the case of a 7-bit DAC (N=7) with INL curves depicted without applying compensation, e.g., curve 301, and after applying compensation, e.g., curve 304 showing the resulting improvement, using three thermometer bits (Nth=3) according to embodiments herein. An embodiment of the present disclosure describes the adjusting of each of the thermometer bit segments to achieve the INL (in LSBs) closer to a straight line INL=0.

Figure 4B:
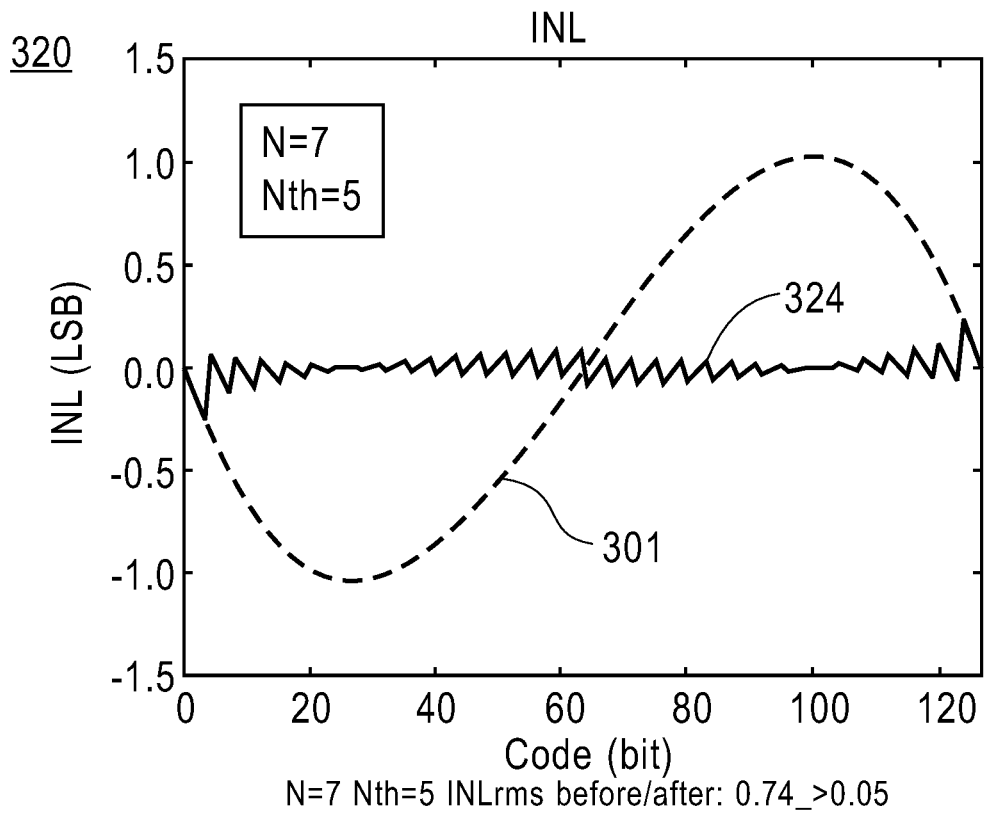
FIG. 4B depicts a plot of the INL (Y-axis) versus the DAC input code (X-axis) for the case of a 7-bit DAC (N=7) with INL curves depicted without applying compensation and with applying compensation, e.g., using five thermometer bits in an example embodiment.

FIG. 4B similarly depicts a plot 320 of the INL (Y-axis) versus the DAC input code (X-axis) for the case of a 7-bit DAC (N=7) with INL curves depicted without applying compensation, e.g., curve 301, and after applying compensation, e.g., curve 324 showing the resulting improvement, using five thermometer bits (Nth=5) according to embodiments herein. Using the calibration circuit and methods described herein, the adjusting of each of the thermometer bit segments renders the INL (in LSBs) as close as possible to a straight line INL=0. As a comparison of FIGS. 4A and 4B shows, the nonlinearity of the DAC can be compensated more accurately (with less residual INL) when more of the DAC bits are encoded as thermometer bits. As illustrated previously in FIG. 3A, in the case of a fully thermometer-encoded DAC, the calibration circuit can adjust the DAC output after calibration to exactly match the ideal output resulting in exactly INL=0.

In an embodiment, calibration circuitry is used to measure the average INL on each of the $2^{Nth}-1$ segments and adjust thermometer segments based on average INL. Adjusting thermometer segments entails changing a strength of a particular segment corresponding to a particular code. For example, increasing a strength of the DAC segment corresponding to a thermometer bit may entail calibrating (i.e., modifying) a DAC segment circuit in order to increase its output signal strength, e.g., by increasing a voltage from 2.0 V to 2.2 V for example. Similarly, decreasing a strength of the DAC segment corresponding to a thermometer bit may entail calibrating (i.e., modifying) a DAC segment circuit in order to decrease its output signal strength, e.g., from 2.0 V to 1.8 V, for example. In the case of a CML (current-mode logic) circuits, increasing/decreasing a strength of a DAC segment can entail modifying a current source at the DAC segment such as by increasing/decreasing an amount of current produced by a current source in the DAC segment circuitry in response to a corresponding activated bit. Different embodiments can implement different techniques for adjusting the strength of a thermometer segment in the DAC.

As shown in the example of FIG. 4A, there is depicted thermometer segment sections of the curve labeled 0-7 corresponding to ($N^{th}-1$ or seven) thermometer bit segments, and in a calibration example, segments 1, 2, . . . , 5, 6 etc. would have an applied compensation or be tuned by decreasing their strength so that their INL errors are reduced, i.e., the DAC moves the output closer to a linear curve (bringing the INL of each segment of the curve to an average of zero). This would entail first obtaining an average INL value along a particular section of the curve, e.g., using line 313 along curve 301 of corresponding section labeled 1 (codes [16-31]). For example, for section labeled 1, using line 313 obtains an average INL value of about −0.9 LSB and the DAC segment corresponding to thermometer bit (1) will be tuned to increase its corresponding output signal strength (e.g., voltage) by a corresponding amount (e.g., 0.9 LSB) shown as resulting reduction 315 to bring the INL curve 304 closer to INL=0 after applying the compensation. All thermometer DAC segments 1, 2, etc. corresponding to thermometer bits would have applied compensation or be tuned by increasing or decreasing their strength based on their average INL in order to bring these thermometer bit DAC segments closer to a linear curve (closer to the linear INL=0). For example, for the subsequent section labeled 5 (codes [80-95]), using line 312 obtains an average INL value of about 0.7 and the DAC segments corresponding to thermometer bit (1) (2) (3), (4) and (5) will be tuned to decrease their total corresponding output signal strength (e.g., voltage) by a corresponding amount (e.g., 0.7) shown as resulting reduction 314 to bring the INL curve 304 closer to the linear INL=0 after applying the compensation. As illustrated by that example, the first section labeled 1 requires an adjustment of thermometer segment (1) only, while the second section labeled 2 requires an adjustment of segments (1) and (2), etc. This can be performed iteratively by first adjusting the strength of only segment (1) based on the section 1, then further adjusting the strength of only segment (2) based on the section 2 and repeating that process iteratively. As seen in FIG. 4A, the rms value of the INL is reduced from 0.74 LSB to 0.30 LSB after the adjustment.

FIG. 4B presents the similar compensation process in the case of another 7-bit DAC, this time one that includes 5 bits of thermometer encoding (N=7, Nth=5). As noted above, in this embodiment, the proposed method is even more beneficial given the finer-grain value of each thermometer segment, and the INL rms value is reduced from 0.74 LSB to 0.05 LSB after the adjustment of all 32 thermometer segments.

Note that both FIGS. 4A and 4B do not specifically address the question of differential operation of the DAC.

Figure 5:
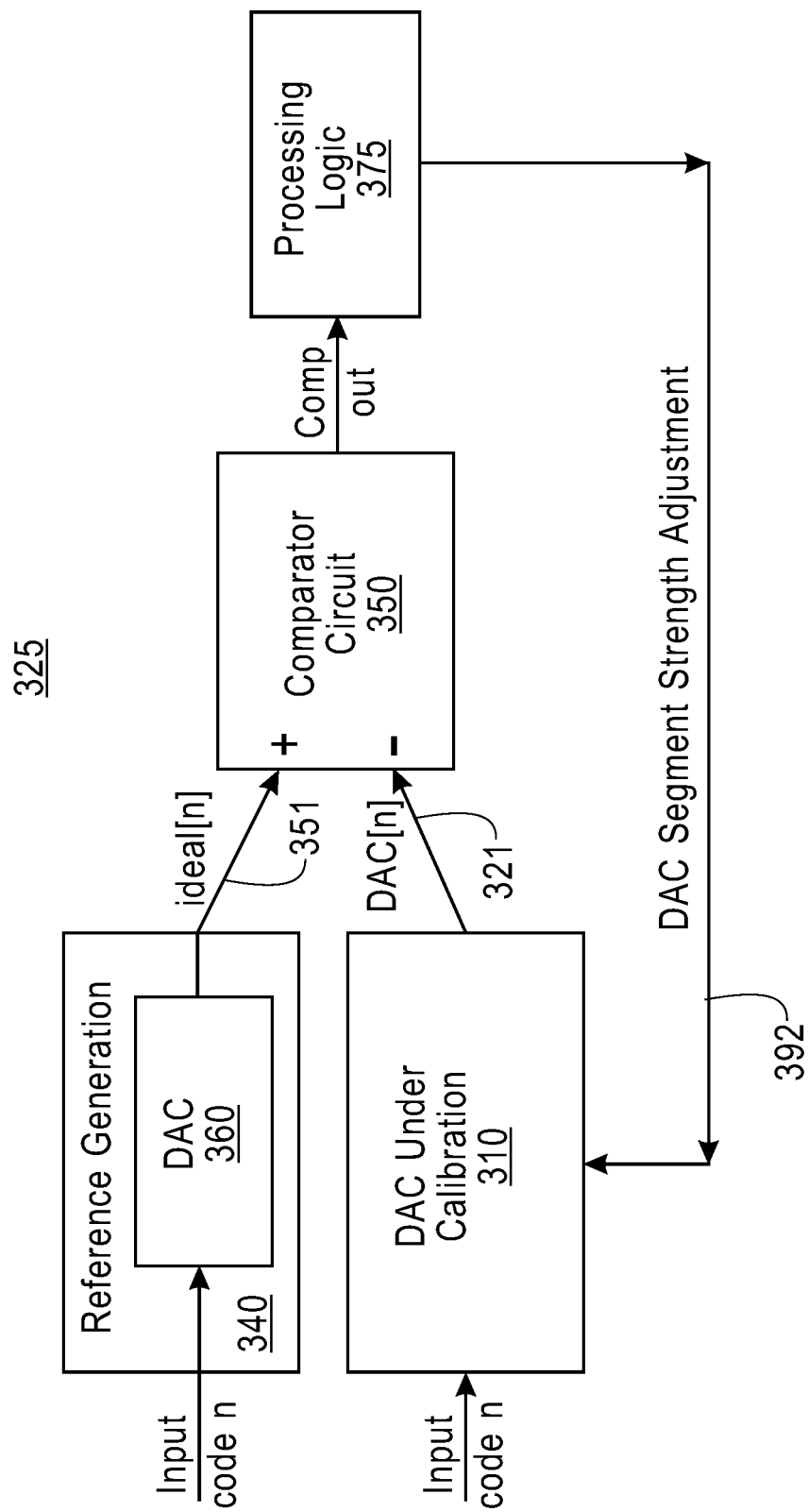
FIG. 5 shows a first embodiment of a calibration circuit and method.

FIG. 5 presents a first circuit implementation 325 of a calibration method according to an embodiment. A given input code [n] is applied to the DAC under calibration 310, generating a signal DAC[n] 321. A second circuit, a reference signal generation circuit 340 generates for the same input code n an ideal output ideal[n] 351 that is completely linear, i.e., ideal[n] corresponds to the line 204 in FIG. 2. Then, a comparison circuit 350 compares DAC[n] 321 to ideal[n] 351, and the output of the comparison circuit 350 is received by a processing logic circuit 375 which generates signals 392 used to adjust the DAC segment strengths to minimize the error DAC[n]−ideal[n]. In a first embodiment, the reference generation can comprise a high-linearity high-resolution auxiliary DAC 360; the comparison circuit 350 can comprise an operational amplifier or a strong-arm latch, and the processing logic can comprise a finite state machine (FSM).

Figure 6A:
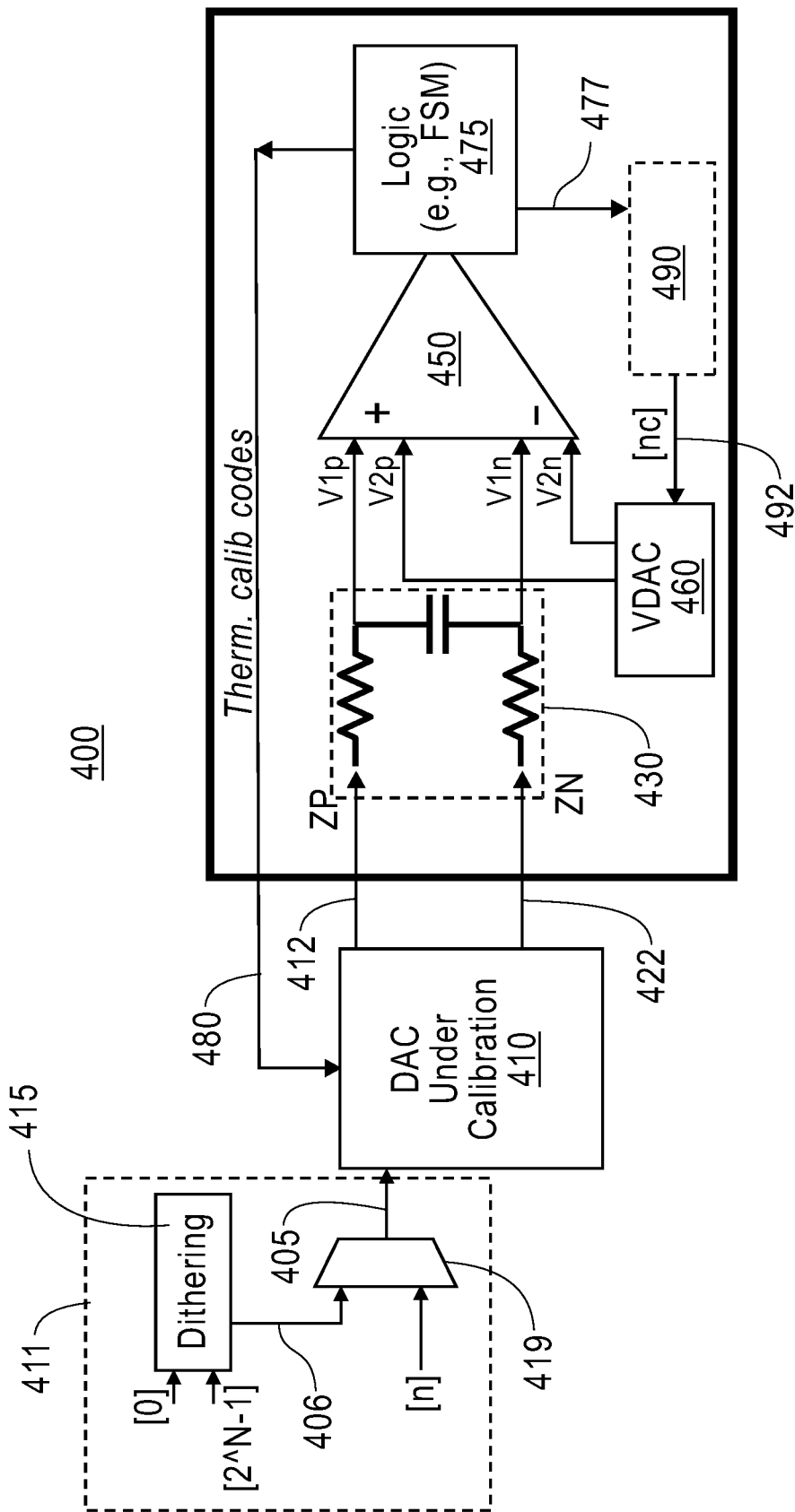
FIG. 6A shows a second embodiment of a calibration circuit and method.

FIG. 6A shows a second embodiment of a calibration circuit 400 for a differential DAC 410 that can be used to adjust each of the DAC thermometer bit segments to render the INL (in LSBs) as close as possible to a straight line INL=0. As shown in FIG. 6A, the calibration circuit 400 is configured to adjust DAC segment strengths in order to eliminate the INL for a given N-bit input code. In FIG. 6A, calibration circuit 400 operates to adjust the DAC segment strengths so that for a given DAC input code n. (e.g., [n]), the output of the DAC segments after calibration will now match the ideal DAC output, e.g., curve 204, FIG. 2.

Based on a received input DAC codeword [n] 405, the activated DAC segments associated with DAC 410 output a differential signal, e.g., voltage across differential output lines 412 ("ZP"), 422 ("ZN") that is averaged through a resistance-capacitance (low-pass filter) circuit 430 and received as input at a comparator device 450 at respective inputs V1$p$ and V1$n$ for comparison. These differential outputs ZP and ZN represent the output of the DAC segments before calibration as shown along the curve 201 of FIG. 2 for that specific input code word 405 and are used to determine an amount of the thermometer segment compensation of the DAC being calibrated. That is, these DAC outputs V1$p$ and V1$n$ are compared with respective outputs of an auxiliary VDAC 460 labeled as outputs V2$p$ and V2$n$ and the comparison results are used to generate calibration signals that can correct non-linearities among the segments to provide an ideal DAC output corresponding to that codeword that will result in no INL error. These auxiliary VDAC 460 outputs V2$p$ and V2$n$ had been generated in a previous first operation step and serve as reference outputs for each codeword and represent the low-pass circuit filtered, time averaged value of an output of a dithering circuit that receives and applies minimum and maximum input code words to the DAC under calibration at a determined duty-cycle to obtain a first output voltage and thus represent ideal DAC outputs that can result in DAC output response curve 204 in FIG. 2. Such VDAC reference outputs representing the ideal DAC output are compared with the corresponding output of the DAC 410 responsive to an input codeword and the comparator 450 generates an output signal used to adjust the DAC segment strengths in order to avoid DAC output compression that causes INL, and shape the INL curves 304, 324 of FIGS. 4A and 4B, respectively, to become linear and equal to zero. For the given input DAC codeword 405, based on the respective differences between DAC output V1$p$ and VDAC reference V2$p$ and between DAC output V1$n$ and VDAC reference V2$n$, the output of the comparator device 450 feeds into a finite state machine (FSM) or like controller circuitry 475 implementing logic to calibrate the DAC 410. That is, based on these differences, FSM 475 generates thermometer calibration codes 480 used to adjust the strengths of the particular thermometer segments. In an embodiment, the thermometer calibration codes can be used to adjust circuit current sources in the DAC 410 that would increase or reduce DAC output strengths of the particular thermometer segments corresponding to that input codeword to ensure a linear curve (e.g., curve 204, FIG. 2).

Details of Operation of the Circuit:

In greater detail, calibration circuit 400 operates to adjust the DAC segment strengths so that for a given DAC input code n, (noted [n]), the output of the DAC (curve 201 in FIG. 2) is altered so that it matches the ideal DAC output (e.g., linear curve 204 in FIG. 2). In an embodiment, DAC sensing needs to be differential. The calibration circuit in an embodiment can generate the ideal DAC segment output line 204 by dithering between 0 and a maximum code effectively using the DAC 410 and low pass filter 430 as a 1-bit ΔΣ DAC. In an embodiment, as shown in more detail in FIG. 6A, a code dithering circuit block 415 applies minimum input code (e.g., code [0]) and maximum input code (e.g., code $2^N-1$) to the DAC under calibration with a time-averaged value proportional to the first input code. In FIG. 6A, a multiplexor (MUX) 419 at the input of the DAC under calibration either receives the fixed code [n], or a dithering signal that is provided by the dithering circuit as an output 406 that is alternately 0 or $2^N-1$ with an average value of n.

In operation, in a first phase, the DAC is programmed to have alternately an input code 0 for $2^{N-1}-n$ clock cycles and an input code $2^{N-1}$ for n clock cycles as provided by dithering circuit 415 through MUX 419. Hence the voltage difference value of V(ZP)−V(ZN) is alternately DAC[0] and DAC[$2^{N-1}$]. The resistance-capacitance circuit 430 acts as a low pass filter, hence the differential voltage V1$p$−V1$n$ is equal to Videal[n] computed according to equation 1) as follows:

$$Videal[n] = \frac{[(2^N - n - 1) * DAC[0] + n * DAC[2^N - 1]]}{2^N - 1} \quad (1)$$

where DAC[0] corresponds to the left DAC extreme endpoint 241 of FIG. 2 (i.e., the output of the DAC when the input code is "0") and DAC[$2^N-1$] corresponds to the right DAC extreme endpoint 242 of FIG. 2 (i.e., the output of the DAC when the input code is "$2^N-1$"), the coefficient "$2^N-n-1$" of the DAC[0] term refers to the corresponding amount of clock cycles spent dithering at that DAC input code and the coefficient "n" of the DAC[$2^N-1$] term refers to the corresponding amount of clock cycles spent dithering at that DAC input code. Applying the $$\frac{[(2^N - n - 1) * DAC[0] + n * DAC[2^N - 1]]}{2^N - 1}$$

formula of equation 1) for a given input DAC codeword [n], this dithering achieves an output voltage which would correspond to a DAC output point on the ideal linear curve 204 in FIG. 2.

Returning to FIG. 6A, the value of V1$p$–V1$n$ corresponds to the ideal DAC output for a code [n] which is noted as Videal[n]. This ends the first phase of operation.

Then, in a second phase of operation, using a VDAC control logic 490, based on a control output signal 477 from controller circuit 475, the auxiliary VDAC input code [nc] 492 is adjusted, resulting in a differential output V2$p$–V2$n$=VDAC[nc]. The auxiliary DAC input code [nc] is tuned until the differential comparator is metastable, i.e., is triggered to switch from an output value of 0 to 1 (or vice versa), resulting in V2$p$–V2$n$=V1$p$–V1$n$, i.e. VDAC[nc]=Videal[n]. This ends the second phase of operation.

In a third phase of operation, the DAC 410 under calibration is operated with the fixed input code [n], while the auxiliary VDAC input code 492 is kept to [nc]. Thus, the voltages appearing at the inputs to the comparator are now V1$p$–V1$n$=DAC[n] and V2$p$–V2$n$=VDAC[nc]=Videal[n].

The DAC thermometer segment strengths are then adjusted until the comparator is metastable, i.e., is triggered to switch from an output value of 0 to 1 (or vice versa). At that point, the input differentials are equal, i.e., V2$p$–V2$n$=V1$p$–V1$n$, i.e. DAC[n]=Videal[n], as desired. This ends the third and final phase of operation.

It is noted that the auxiliary VDAC 460 is effectively used only to store temporarily the DC voltage at the output of the low-pass filter circuit 430, which is produced when the dithering circuit 415 receives and applies minimum and maximum input code words to the DAC under calibration at a determined duty-cycle value, with a time-averaged value of the DAC output representing an ideal DAC output. Hence requirements are relaxed: the auxiliary VDAC 460 does not need to be linear, or to have known value steps (i.e., the absolute value of VDAC[nc] is not critical). In embodiments, there is a relaxed linearity requirement on VDAC, and no offset requirement on the comparator 450. The auxiliary VDAC 460 does not even need to be monotonic, and a simpler coarse/fine implementation is acceptable. The only requirement is for the VDAC step to be significantly finer than the main DAC 410 adjustment steps. Similarly, the comparator offset does not need to be corrected because the voltages being compared (DAC[n] and Videal[n]) are always applied to the same inputs of the comparator 450. For example, assuming the comparator has an offset $\Delta V$, then the first step will lead to V1$p$–V1$n$=V2$p$–V2$n$+$\Delta V$. i.e. VDAC[nc]+$\Delta V$=Videal[n]. After the second step there will be had VDAC[nc]+$\Delta V$=DAC[n], still resulting in DAC[n]=Videal[n], as desired.

Figure 7:
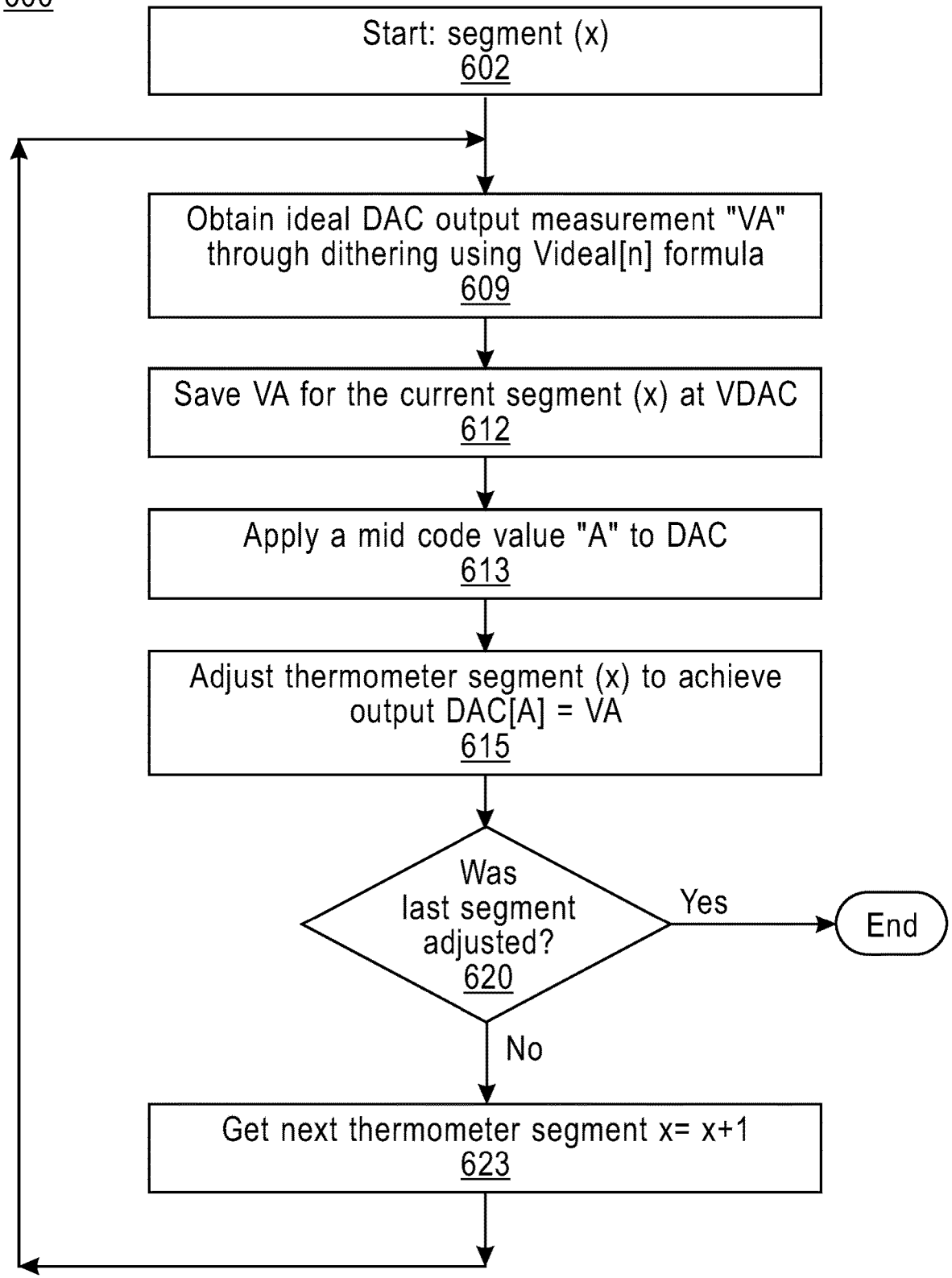
FIG. 7 depicts one non-limiting embodiment of a method of calibrating an N-bit DAC having thermometer bits corresponding to thermometer segments using the calibration circuit of FIG. 6A.

FIG. 7 depicts one non-limiting embodiment of a method 600 of calibrating an example N-bit DAC 410 having thermometer bits. In a non-limiting, illustrative example, calibration method 600 can be applied to an N-bit DAC in which thermometer encoding is applied to the top three bits (Nth=3), using the calibration circuit 400 of FIG. 6A. The thermometer bits correspond physically to 7 thermometer segments. At a first step 602, calibration starts for a first thermometer segment "x", e.g., x=1 or segment (1). By applying the dithering between codes [0] and [$2^N$–1] to the input of the DAC with a controlled duty-cycle, followed by a low-pass-filter averaging, an ideal DAC output measurement VA is obtained at 609 where VA is equal to the value of Videal[n] from the equation (1). The specifics of the dithering implementation can correspond to the first phase operation in the previous description of FIG. 6A. At 612, this output value VA is saved with the auxiliary VDAC 460 of the calibration circuit for calibrating this segment x, e.g., x=1. As an example, an input mid-code value [A]="24" would produce the following VA output:

$$VA = \frac{[(2^N - n - 1)*DAC[0] + n*DAC[2^N - 1]]}{2^N - 1}$$

$$VA = [(127 - 24)*DAC[0] + 24*DAC[127]]/127$$

To perform the save operation, the auxiliary VDAC input code is adjusted until its output matches VA, then the input code is saved, effectively saving VA at the output of the VDAC. This corresponds to the second phase of operation in the previous description of FIG. 6A.

Then at 613, the DAC is set to a constant mid code value [n]=A, for example, producing a DAC output DAC[A], for example A=24 in the example above. In a general case with a N-bit DAC and Nth thermometer bits, for the thermometer segment x, the mid code would be DAC[$2^{(N-Nth-1)}$+x*$2^{(N-Nth)}$]. Then, at 615, the calibration circuit adjusts the thermometer segment (x) to get the output DAC[A]=VA based on monitoring of the output of the comparator. This corresponds to the third phase of operation in the previous description of FIG. 6A. The process then repeats for each of the remaining segments, e.g., thermometer segments (2), (3) . . . (7). That is, continuing from 615, a determination is made at 620 to determine if the last thermometer segment, e.g., segment (7), was adjusted. If the last segment was not adjusted, then the next thermometer segment x=x+1 is being processed at 623, and the process returns to 609 where each of the calibrating steps 609-615 are performed to compensate the current thermometer segment. Otherwise, at 620, once all of the thermometer segments have been compensated, then the process will end.

Figure 8:
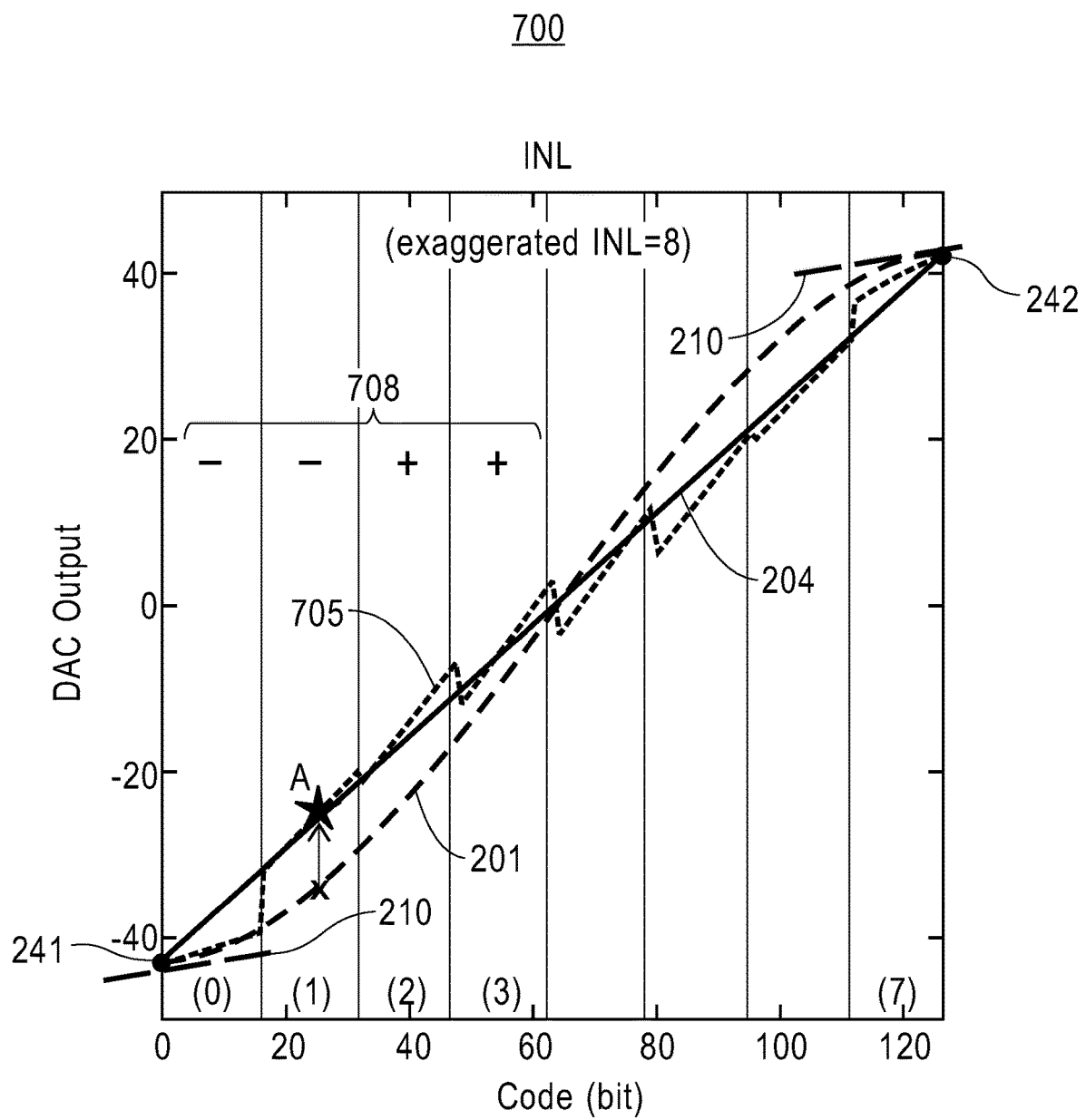
FIG. 8 shows a further plot corresponding to the plot of FIG. 2 depicting the ideal linear DAC output curve and the original DAC output curve without thermometer segment compensation, but also depicting the resulting DAC output curve after compensating each thermometer segment labeled (0), (1), . . . , (7) by applying the calibration method of FIG. 7.

FIG. 8 shows a further plot 700 corresponding to the plot of FIG. 2 depicting the ideal linear DAC output curve 204 and the original DAC output curve 201 without thermometer segment compensation; in addition, it further depicts the resulting DAC output curve 705 after compensating each thermometer segment labeled (0), (1), . . . . (7) by applying the calibration method of FIG. 7. That is, by calibrating the DAC 410 using the circuit 400 of FIG. 6A, the output curve 705 depicts the result of calibrating (adjusting) the strength of each DAC segment to move the thermometer segments (curve 201) up or down. For example, in a CML DAC the biasing of each thermometer segment can be adjusted to increase or decrease the segment output current. In another example, in a Source-Series-Terminated driver (SST) DAC, the number of header/footer devices of each thermometer segment can be switched to increase or decrease the segment impedance.

The calibration circuit embodiment depicted in FIG. 6A describes one embodiment of the circuit and method where the reference generation is implemented by dithering and low-pass filtering of the DAC under calibration, while the comparison circuit is implemented by sequential comparison of the two signals against an auxiliary DAC. Those embodiments are referred to herein as a dithering generator and sequential comparator. Alternate embodiments of the reference generation circuit include the use of a high-precision and high linearity second reference DAC directly generating the ideal reference voltage as presented in FIG. 5. and FIG. 6B. Alternate embodiments of the comparison circuit include directly using a standard comparator performing the comparison of both inputs at the same time. Those embodiments are referred to herein as a high-precision generator and direct comparator. The generator and comparator embodiments can be combined in different ways. The embodiment described in FIG. 6A illustrates the combination of a dithering generator circuit 415 and sequential comparator. In a second embodiment, shown in FIG. 5, a high-precision generator generates the reference, and a direct comparator performs the comparison. In a third embodiment, shown in FIG. 6B, a high-precision generator generates the reference, and a sequential comparator performs the comparison. In a fourth embodiment, shown in FIG. 6C, a DAC input generation circuit 411 including a dithering generator 415 and multiplexor circuit 419 generates the reference, and an alternate embodiment of the sequential comparator performs the comparison.

Figure 6B:
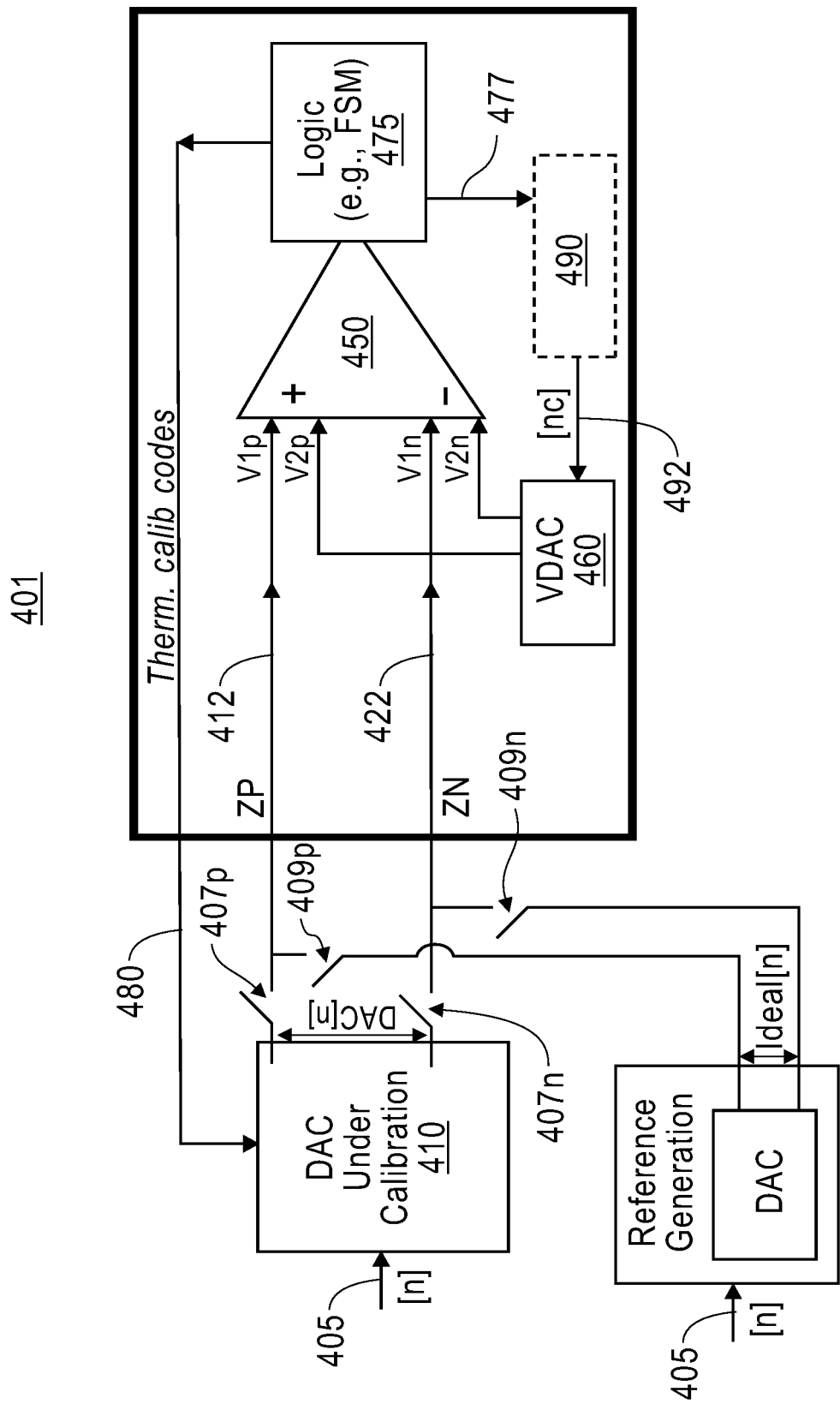
FIG. 6B depicts an alternate embodiment of a calibration circuit having a reference generation circuit including the use of a high-precision and high linearity reference DAC for directly generating the ideal reference voltage.

FIG. 6B depicts a further embodiment of a DAC calibration circuit 401 comprising a high-precision generator and a sequential comparator. In FIG. 6B, a fixed code 405 is applied to the DAC under calibration 410 generating at the output of 410 a differential signal DAC[n]. In parallel, the reference generation circuit produces an ideal differential signal ideal[n]. Those two signals DAC[n] and Ideal[n] are applied sequentially to the comparison circuit via a respective set of programmed switches 407p, 407n and 409p, 409n connecting the V1p/V1n inputs of 450 alternately to DAC[n] or ideal[n]. The rest of the comparison function operates as described previously in FIG. 6A.

Figure 6C:
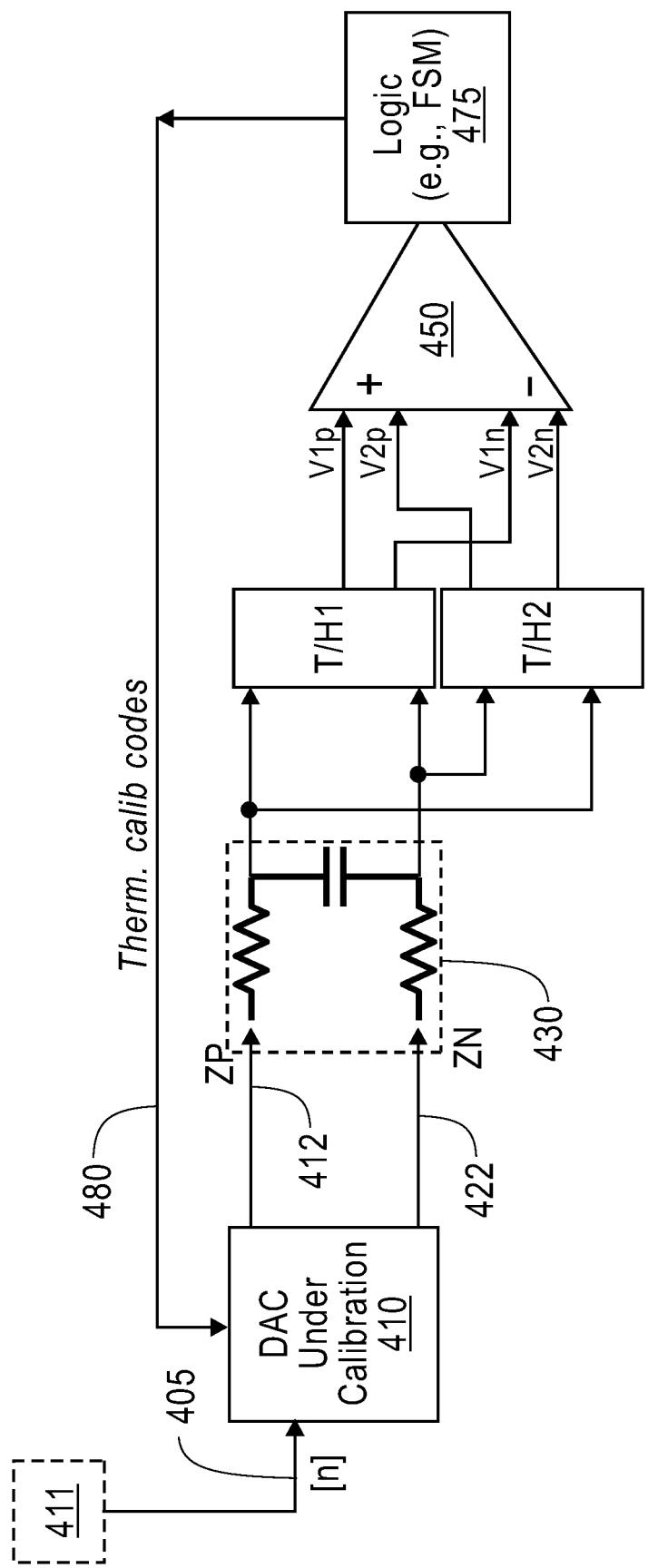
FIG. 6C depicts a further embodiment of a calibration circuit comprising a dithering generator and a direct comparator.

FIG. 6C depicts an embodiment comprising the DAC input generation circuit 411 including dithering generator circuit and is an alternate embodiment of the sequential comparator. As described previously in FIG. 6A, the DAC under calibration 410 operates alternately: first with a dithering code, generating ideal[n] at the output of the low-pass filter 430, and then at a fixed code, generating DAC[n]. Those generated outputs are sequentially captured by a track and hold circuit pair T/H1 and T/H2, respectively, so that the comparator 450 is provided with a signal DAC[n] on inputs V2p/V2n and ideal[n] on inputs V1p/V1n. Here the track and hold circuit T/H1 performs the analog storage of the first sequential dithered output of the DAC under calibration, in a similar role as the VDAC 460 of the first sequential comparator previously described in FIG. 6A.

The circuit embodiment presented in FIG. 6A does not require a precision high-linearity auxiliary DAC, and it does not require a comparator with a low offset or additional T/H circuits.

Figure 9A:
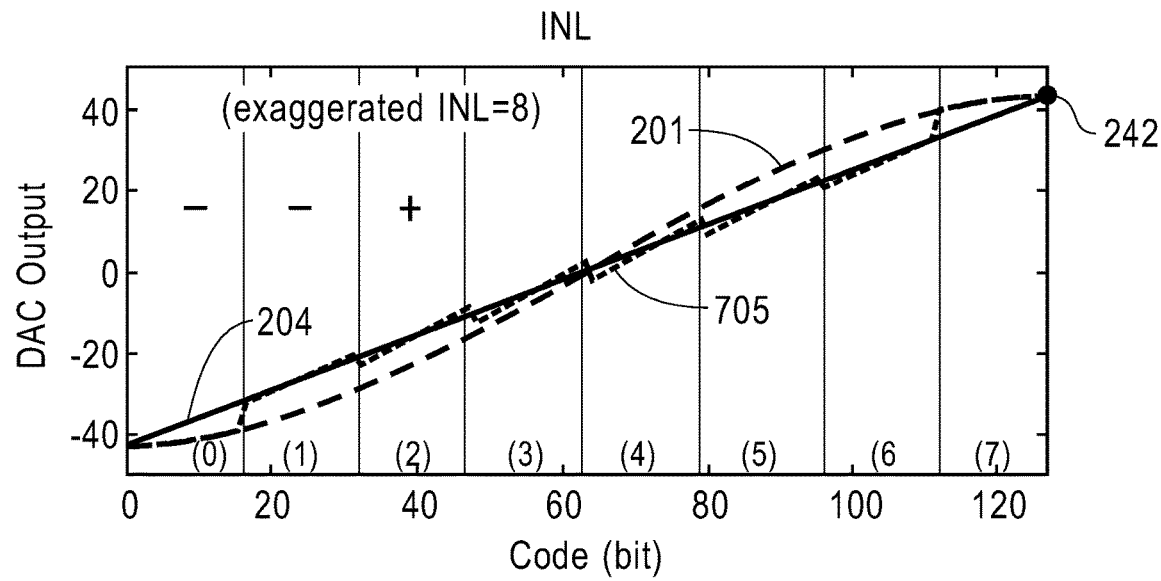
FIGS. 9A and 9B depict an additional thermometer segment compensating scheme in which the order of adjusting the DAC thermometer segments for INL reduction is modified according to a further embodiment.
Figure 9B:
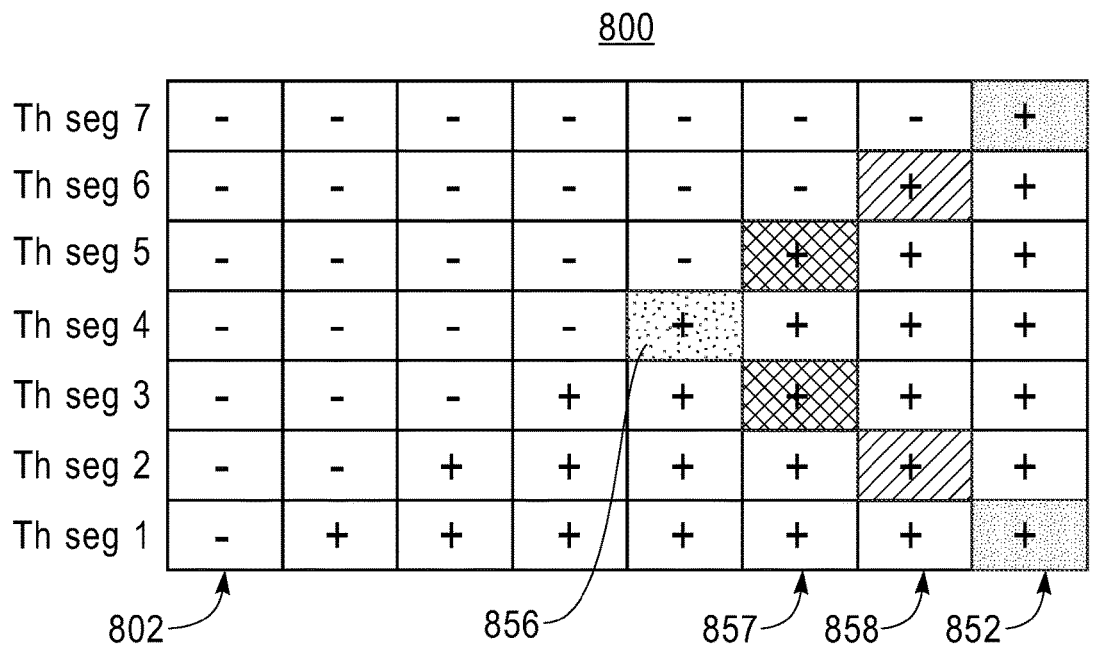

Referring back to FIG. 8, as the embodiment in the example described herein relates to the DAC operating in differential fashion, then the differential DAC segment calibrations are in an adjustment mode corresponding to +1 or −1 modes 708. That is, as shown in FIG. 8, the differential DAC segment calibrations are deemed as being in −1 mode for segments up to the input mid-code value [A]="24", and then starting calibration of differential DAC segment tuning of thermometer segment labeled (2), differential DAC segment calibrations are changed to being in +1 mode for successive segments. However, the differential segment tuning (2) can impact tuning (DAC output) of prior segments (0), (1). Thus, an additional thermometer segment compensating scheme 800 is developed as shown in FIGS. 9A and 9B, in which the order of adjusting the segments for INL reduction is modified. In FIG. 9B, a chart 800 represents the additional thermometer segment compensating scheme and depicts the setting of the thermometer segments 1 to 7 for each of the 8 DAC input code ranges (0) to (7). For example, when the DAC input code is in the first range (0)— corresponding to input codes 0 to 15—all thermometer segments are in the (−) mode as shown at column 802.

Conversely, in the DAC input code range (7) all thermometer segments are in the (+) mode. However, in the adjustment scheme shown in FIG. 9B, the method initially adjusts the thermometer segment Th seg 4 at 856 to bring the INL to "0" on codes for segment (4). This corresponds to moving the DAC output curve 201 at that segment to result in the compensated output curve 705 to the midpoint of the ideal INL curve 204 at segment (4). Then, as shown in FIG. 9B, at column 857, the strengths of segments Th seg. 3 and Th seg 5 are next adjusted together (simultaneously) to bring the INL to 0 on codes (5) which has the effect of avoiding any impact to the prior calibrated segment range of Th seg 4. This is because the segments Th seg 3 and Th seg 5 have opposite polarity in the code range (4). Similarly, as a next step, as shown in FIG. 9B, at column 858, the strengths of segments Th seg 2 and Th seg 6 are next adjusted together to bring the INL to 0 on codes (6) which has the effect of avoiding any impact to the prior calibrated segment ranges (4) and (5), i.e., does not impact Th seg 4, Th seg 5 due to segments (6) and (2) being of opposite polarity in code ranges (4) and (5). Similarly, in a next step, as shown in FIG. 9B, at column 852, the strengths of segments Th seg 1 and Th seg 7 are next adjusted together to bring the INL to 0 on codes (7) which has the effect of avoiding any impact to the prior calibrated segment ranges (4), (5) and (6), i.e., does not impact Th seg 4, Th seg 5, Th seg 6. In this step, the midpoint of the curve 204 is not used, but the end point 242 is used to keep the original DAC total swing constant. It is worth noting that thanks to the symmetric nature of the differential DAC, this calibration performed over the code ranges (4), (5), (6), (7) results in symmetrical INL reduction in the ranges (3), (2), (1), (0) without requiring specific measurements in those ranges. Note that to compensate for non-ideal asymmetric behaviors of some segments, a further embodiment of the method described above can consist in performing an iterative second pass of measurements in the ranges (3), (2), (1), (0).

While the calibrating scheme depicted in FIGS. 9A and 9B do not reduce INL on the two extreme segments (0) and (7), it is possible to increase the binary section of the DAC by a factor $(1+\beta)$ while scaling all thermometer bits by $(1-2^{-Nth}\beta)$ keeping the output swing (i.e., $DAC[2^{N-1}]-DAC[0]$) constant and improving further the root-mean-square (rms) INL. The INL improvement comes at the cost of an increase in DNL in some of the code transitions. In an embodiment, $\beta$ can also be adjusted in the background with a running link based on Bit Error Rate (BER) feedback from the link transmitter.

Figure 10A:
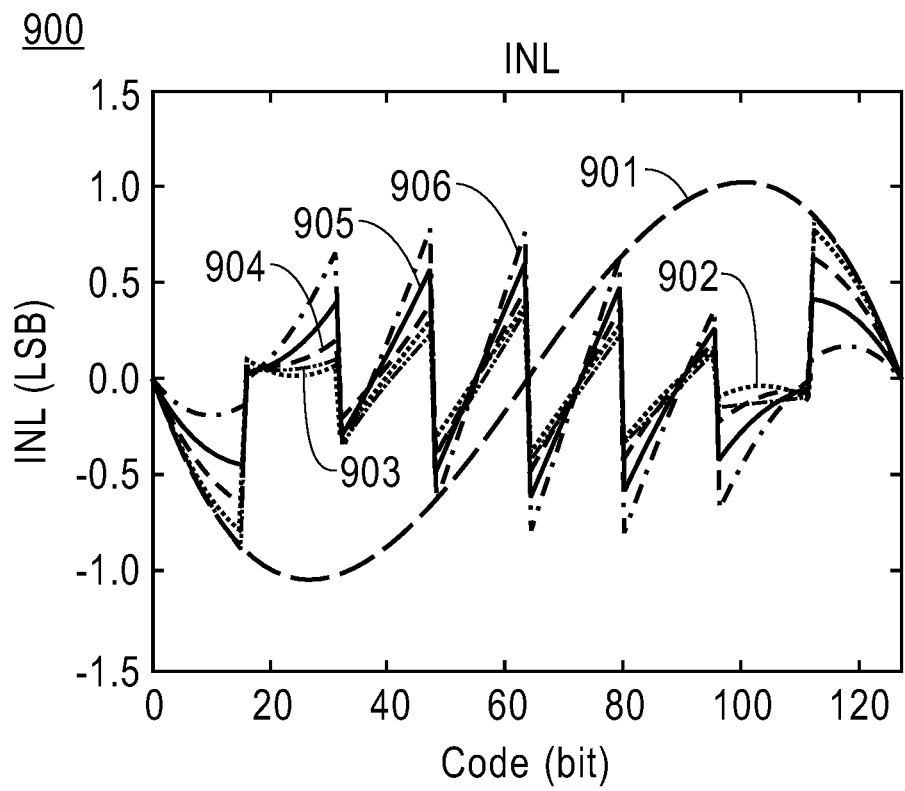
FIG. 10A illustrates plots depicting the INL for a differential segmented 7-bit DAC with 3 thermometer bits for different input codes 0 to 127 in an embodiment.

FIG. 10A illustrates a plot 900 of the INL for a differential segmented 7-bit DAC with 3 thermometer bits for different input codes 0 to 127. It shows the INL profile before calibration 901, showing a peak to peak INL of 1 LSB. The graph also presents the INL profile 902 after the standard calibration of the thermometer segments described herein. Lines 903, 904, 905, 906 correspond to the DAC outputs applying both the standard calibration of the thermometer segments and a scaling of both thermometer and DAC segments described hereinabove, with β values of 0.005, 0.01, 0.015 and 0.02, respectively.

Figure 10B:
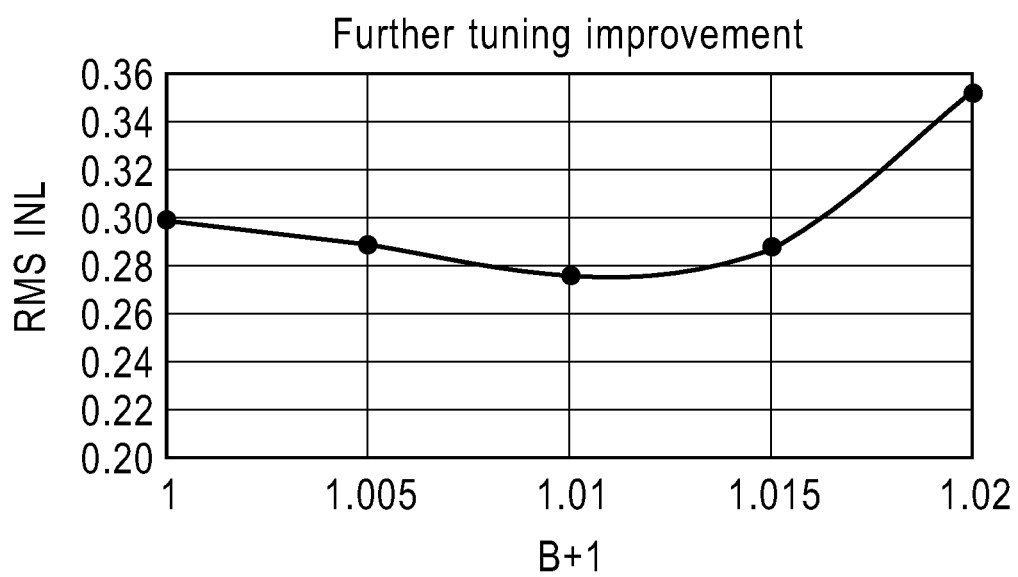
FIG. 10B illustrates a plot depicting the resulting root-mean-square (rms) value of the INL on the graphs shown in FIG. 10A according to an embodiment.

FIG. 10B illustrates a plot of RMS INL values (Y-axis) as a function of the β scaling factors (X-axis) and particularly the resulting root-mean-square (rms) value of the INL on the graphs 902 to 906 of FIG. 10A. As seen in FIG. 10B, a beta value of 1.01 can provide an additional 7.8% additional reduction in the rms INL. However larger values of beta result in a degradation of the rms INL. Hence, it can be beneficial to adjust the value of beta dynamically based on system-level metrics, such as the bit error rate (BER) of a wireline link.

The method and circuits described herein performing the DAC calibration are simple enough to be integrated on-chip as part of a startup routine. The calibration method of FIG. 7 is not limited for application to TX DAC, any (high-speed) DAC would benefit from it.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays, or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. Further, as used herein, the term "substantially equal" refers to signals whose difference is less than the tuning step of one of the DAC segment's strength adjustment. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all elements in the claims below are intended to include any structure, material, or act for performing the function in combination with other claimed elements as specifically claimed.

The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system for calibrating a multi-bit digital-to-analog converter (DAC) device having thermometer encoded segments, the system comprising:
    a comparison circuit having a first input for receiving a first output voltage of the multi-bit DAC device responsive to an N-bit input digital code word, where N>1;
    a reference multi-bit digital-to-analog converter circuit (DAC) exhibiting a lower integral non-linearity than the receiving the same N-bit input digital code word and outputting a second output voltage representing an ideal linear output of the multi-bit DAC under calibration, a second input of said comparison circuit receiving the second output voltage, the comparison circuit comparing the first output voltage of the multi-bit DAC under calibration and the second output voltage representing the ideal linear output to generate an output signal; and
    a processor device connected to an output of the comparison circuit for detecting the output signal, the processor device generating one or more calibration signals for input to the multi-bit DAC for adjusting a signal strength of different thermometer encoded segments of the multi-bit DAC under calibration to non-equal values, the adjusted signal strengths of different thermometer encoded segments to the non-equal values minimizing the difference between the first output voltage of the multi-bit DAC under calibration and the second output voltage representing the ideal linear output thereby compensating a multi-bit DAC integral non linearity (INL).

2. A system for calibrating a digital-to-analog converter (DAC) device having thermometer encoded segments, the system comprising:
    a code dithering circuit applying minimum and maximum input code words to the DAC under calibration at a determined duty-cycle to obtain a first output voltage comprising a time-averaged value proportional to a corresponding input digital code word with a high degree of linearity;
    a low-pass filter configured to remove high frequency components of the first output voltage comprising the time-averaged value from the DAC under calibration to generate a direct current (DC) signal that is equal to the time averaged value of the first output voltage;
    a logic circuit applying secondly a fixed input digital code word to the DAC under calibration, and the DAC under calibration generating subsequently a second output voltage;
    a comparison circuit receiving in a sequence, firstly the output DC signal of the low-pass filter circuit, and secondly the second output voltage for use in a comparison operation, said comparison circuit generating a representation of the DC signal for local storage in a memory before the comparison with the second output voltage to responsively generate an output signal; and
    a processor device connected to the output of the comparison circuit for detecting the output signal, the processor device generating one or more calibration signals for input to the DAC under calibration for adjusting a signal strength of different thermometer encoded segments of the DAC under calibration to minimize the difference between the DC signal representation and the subsequently received second output voltage to thereby reduce an integral non linearity (INL) of the DAC under calibration.

3. The system as claimed in claim 2, wherein said comparison circuit comprises:
    a comparator device having a first input receiving, in the sequence, firstly the DC signal output of the low-pass filter circuit, and secondly the second output voltage.

4. The system as claimed in claim 3, further comprising:
    a voltage digital-to-analog converter circuit (VDAC) having an output connected to a second input of the comparator device, said VDAC producing a reference output voltage in response to a received adjustable input tuning code signal; and
    an additional processor device for initially adjusting the adjustable input tuning code signal input to the VDAC to obtain an input matching tuning code signal when the reference output voltage matches said DC signal representation, said locally stored representation of the DC signal comprising the obtained matched VDAC reference output voltage.

5. The system as claimed in claim 4, wherein said comparator device is configured in an initial operation to:
    receive, at the first input, the DC signal representing an ideal linear output and receive, at the second input, the reference output voltage of the VDAC responsive to the adjustable input tuning code signal, the comparator device comparing the DC signal with the reference output voltage of the VDAC device responsive to an adjusted input digital code word, the input digital code word being adjusted to a point where the second input of the comparator device is substantially equal to its first input.

6. The system as claimed in claim 5, wherein in a subsequent operation, the comparator device receives at the first input the second output voltage of the DAC under calibration while receiving at the second input the reference output voltage of the VDAC responsive to the adjusted input tuning code signal, the comparator device comparing the received second output voltage of the DAC under calibration with the reference output voltage of the VDAC responsive to the adjusted input tuning code signal.

7. The system as claimed in claim 4, wherein the DAC under calibration generates first differential output voltage signals; the low-pass filter generates a differential DC output voltage; the tuned VDAC circuit generates second differential voltage output signals responsive to the adjustable input tuning code signal; and the first and second inputs of the comparator device are differential inputs.

8. The system of claim 2, wherein the DAC under calibration comprises at least one binary weighted segment and at least two thermometer segments.

9. The system of claim 8, wherein the calibration is performed for one or more DAC input codes, with at least one DAC input code corresponding to a mid-code of the binary weighted segments.

10. The system of claim 8, wherein the binary-weighted section of the DAC strength is adjusted by a multiplicative scaling factor to further reduce the DAC integral non linearity (INL).

11. The system of claim 8 wherein the binary-weighted section of the DAC strength is adjusted based on a system-level metric.

12. The system of claim 2, wherein the comparison circuit comprises:
two track and hold circuits, the first track and hold circuit initially receiving the output DC signal of the low-pass filter circuit that has a value equal to the time-averaged value of the first output voltage proportional to a corresponding input digital code word and storing said output DC signal and subsequently the second track and hold circuit receiving the subsequent second output voltage of the DAC under calibration in response to receiving the corresponding input digital code word and storing said subsequent second output voltage value, and
a comparator device for said comparing that receives at a first input the output voltage of the first track and hold circuit and receives at a second input the output voltage of the second track and hold circuit.

13. A system for calibrating a digital-to-analog converter (DAC) device having thermometer encoded segments, the system comprising:
a reference digital-to-analog converter circuit receiving an input digital code word and outputting a first output voltage representing an ideal linear output of the DAC under calibration,
a logic circuit applying secondly the input digital code word to the DAC under calibration, and the DAC under calibration generating subsequently a second output voltage;
a comparison circuit receiving in a sequence, initially the first output voltage from the reference digital-to-analog converter circuit, and subsequently the second output voltage for a comparison operation, said comparison circuit generating a representation of the first output voltage for local storage in a memory before the comparison with the second output voltage to responsively generate an output signal; and
a processor device connected to the output of the comparison circuit for detecting the output signal, the processor device generating one or more calibration signals for input to the DAC under calibration for adjusting a signal strength of different thermometer encoded segments of the DAC under calibration to minimize the difference between the representation of the received first output voltage of the reference digital-to- analog converter circuit and the subsequently received second output voltage to thereby reduce an integral non linearity (INL) of the DAC under calibration.

14. The system as claimed in claim 13, wherein said comparator circuit comprises a comparator device having a first input receiving, in the sequence, firstly the output of the reference digital-to-analog converter circuit, and secondly the second output voltage.

15. The system as claimed in claim 14, further comprising:
a voltage digital-to-analog converter circuit (VDAC) having an output connected to a second input of the comparator device, said VDAC producing a reference output voltage in response to a received adjustable input tuning code signal; and
an additional processor device for initially adjusting the adjustable input tuning code signal input to the VDAC to obtain an input matching tuning code signal when the reference output voltage matches said first output voltage, said locally stored representation of the first output voltage comprising the obtained matched VDAC output voltage.

16. The system as claimed in claim 15, wherein said comparator device is configured in an initial operation to:
receive, at the first input, the first output voltage representing the ideal linear output and receive, at the second input, the reference output voltage of the VDAC responsive to adjusted input digital code words, the comparator device comparing the first output voltage with the reference output voltage of the VDAC device responsive to an adjusted input digital code word, the input digital code word being adjusted to a point where the second input of the comparator device is substantially equal to its first input.

17. The system as claimed in claim 16, wherein in a subsequent operation, the comparator device receives at the first input the second output voltage of the DAC under calibration while receiving at the second input the reference output voltage of the VDAC responsive to the adjusted input digital code word, the comparator device comparing the received second output voltage of the DAC under calibration with the reference output voltage of the VDAC responsive to the adjusted input digital code word.

18. The system as claimed in claim 15, wherein the reference digital-to-analog converter circuit generates first differential output voltage signals, the tuned VDAC circuit generates differential voltage output signals responsive to the adjusted input digital code word, the DAC under calibration generates second differential voltage output signals in response to receiving the same input digital code word, and the first and second inputs of the comparator device are differential signal inputs.

19. The system as claimed in claim 18, further comprising:
- a switching network including a first set of switch devices timed to pass the first voltage output signals representing the ideal linear output to first differential inputs of the comparator device for the initial operation; and
- the switching network including a second set of switch devices timed to pass the second output voltage signals from the DAC under calibration to the first differential inputs of the comparator device for the subsequent operation.

20. The system of claim 15, wherein the DAC under calibration comprises at least one binary weighted segment and at least two thermometer segments.

* * * * *